United States Patent
Hama et al.

(10) Patent No.: US 7,029,752 B2
(45) Date of Patent: Apr. 18, 2006

(54) PLASTIC CONTAINER FOR LIQUID MEDICINE AND METHOD OF STORING AND RECOVERING LIQUID MEDICINE

(75) Inventors: Kenichi Hama, Tokyo (JP); Tsuyoshi Kage, Tokyo (JP)

(73) Assignee: Mitsubishi Shoji Plastics Corporation, Tokyo (JP)

( * ) Notice: Subject to any disclaimer, the term of this patent is extended or adjusted under 35 U.S.C. 154(b) by 174 days.

(21) Appl. No.: 10/182,812

(22) PCT Filed: Feb. 22, 2001

(86) PCT No.: PCT/JP01/01296

§ 371 (c)(1),
(2), (4) Date: Mar. 5, 2003

(87) PCT Pub. No.: WO01/62202

PCT Pub. Date: Aug. 30, 2001

(65) Prior Publication Data

US 2004/0050744 A1    Mar. 18, 2004

(30) Foreign Application Priority Data

Feb. 24, 2000  (JP) .............................. 2000-048388

(51) Int. Cl.
*B32B 9/00*   (2006.01)
*B32B 1/08*   (2006.01)
*B29D 22/00*  (2006.01)
*B29D 23/00*  (2006.01)

(52) U.S. Cl. .................... 428/408; 428/35.7; 428/36.6; 428/421; 428/422; 206/524.3; 422/41

(58) Field of Classification Search ................. 428/408, 428/457, 469, 698, 701, 480, 35.7, 36.91, 428/36.6, 36.7, 421, 422; D24/224; 206/438, 206/524.1, 524.3, 524.6, 525, 819; 220/62.12, 220/62.22; 422/41
See application file for complete search history.

(56) References Cited

U.S. PATENT DOCUMENTS 4,809,876 A * 3/1989 Tomaswick et al. ...... 220/62.12

FOREIGN PATENT DOCUMENTS

JP        08-053116          2/1996

(Continued)

OTHER PUBLICATIONS

International Preliminary Examination Report.
EPO Search Report.

(Continued)

*Primary Examiner*—Michael C. Miggins
(74) *Attorney, Agent, or Firm*—Hedman & Costigan, P.C.

(57) ABSTRACT

A plastic container for liquid medicine, which, concerning the effective components of liquid medicine, is capable of prevention of deterioration in quality due to mixing of oxygen and water vapor, prevention of variation in concentration due to water volatilization and moisture absorption, etc. A plastic container for liquid medicine, which is a plastic container internally coated with DLC (diamond-like carbon) film wherein water vapor permeability is 0–0.006 g/container/day and oxygen permeability is 0–0.011 ml/container/day, such properties being obtained by optimizing the three conditions, composition, density and film thickness of the DLC film.

6 Claims, 1 Drawing Sheet

FOREIGN PATENT DOCUMENTS

| | | |
|---|---|---|
| JP | 08-053117 | 2/1996 |
| JP | 10-226884 | 8/1998 |
| JP | 11-070152 | 3/1999 |
| JP | 2000-185997 | 7/2000 |
| JP | 2001-031045 | 2/2001 |

OTHER PUBLICATIONS

Communication from EPC.

* cited by examiner

PLASTIC CONTAINER FOR LIQUID MEDICINE AND METHOD OF STORING AND RECOVERING LIQUID MEDICINE

TECHNICAL FIELD

The present invention is related to a carbon film coated plastic container having adaptability as a container filled with a liquid medicine.

In this regard, the term liquid does not only mean liquids, and also includes fluids and semifluids. The term fluids refers to liquids having a high viscosity such as starch syrup, and the term semifluids refers to not only matter in which the same substance is present in solid phase and liquid phase states such as tomato catsup, but also a wide variety of mixtures in which different substances are present in solid phase and liquid phase states such as mayonnaise. Further, the term liquid also includes solutions in which a solute is dissolved in a solvent.

Now, as for adaptability as a container, in addition to the basic properties that there should be (1) good transparency so that the foreign material inspection is not hindered, and (2) no chemical reaction between the container and liquid contents, otherwise the compounding agents, there should also be (3) little water vapor permeability, and (4) little oxygen permeability, and there are cases where many other properties are combined therewith.

PRIOR ART TECHNOLOGY

Generally, because containers made of plastic are easy to form, and have light weight and low cost, such containers are widely used as filled containers in various fields such as foods and medicines and the like.

However, as is well known, plastic is permeable to low molecular gases such as oxygen and carbon dioxide and the like, and low molecular organic compounds are sorbed and permeate through. Furthermore, plastic also has permeability properties relating to water vapor.

Further, even in plastics which have properties that make it difficult for nonpolar gas molecules such as oxygen and carbon dioxide to permeate through, polar molecules such as water molecules and the like are able to permeate through because the permeation mechanism inside the plastic is different from that of the nonpolar molecules described above. Similarly, even in plastics which have properties that make it difficult for polar molecules such as water molecules and the like to permeate through, nonpolar gas molecules such as oxygen and carbon dioxide and the like are able to permeate through because of the different permeation mechanisms.

Consequently, there is virtually no plastic having properties which make it difficult for both nonpolar molecules such as oxygen and carbon dioxide and polar molecules such as water and the like to permeate through. Currently, polyvinylidene chloride is the only plastic understood by the inventors to have both water vaporproof properties and oxygen and carbon dioxide gas barrier properties.

However, polyvinylidene chloride has the disadvantage of having poor mechanical properties, and in the case where an incineration process is carried out for waste, a high temperature incineration is required due to the inclusion of chlorine.

Furthermore, the inventors do not know of any plastic which makes it difficult for the useful protein components dissolved in a solvent to be adsorbed.

For this reason, when compared to glass containers and the like, plastic containers have various restrictions relating to the object of use and the type of use.

SUMMARY OF THE INVENTION

Incidentally, in the case where liquid medicine is filled and packaged, there should preferably be no occurrence of a rise in the concentration of the effective components of the medicine due to the solvent in which the effective components are dissolved escaping as vapor to the outside of the container, or a lowering of the concentration of effective components of the medicine due to contamination with water vapor from the outside of the container. Further, because the effective components of the medicine are adsorbed on the inner wall surfaces of the container when the medicine is poured out from the container, there has been the problem that it is not possible to make effective use of the effective components of the medicine. Furthermore, there has been the problem that the medicine becomes contaminated with impurities such as plasticizers and the like from the plastic material forming the plastic container, whereby the activity of the effective components of the medicine is lowered.

However, because plastic containers have properties such as ease of forming, light weight and low cost and the like, it would be extremely convenient to be able to use plastic containers as containers filled with liquid medicine as described above.

Japanese Laid-Open Patent Publication No. HEI 8-53117 discloses a plastic container which has a DLC (Diamond Like Carbon) film formed on the inner wall surfaces thereof and a method of manufacturing such containers, wherein the container has superior gas barrier properties against oxygen and carbon dioxide, and is adapted for sparkling beverages and carbonated beverages which are sensitive to oxygen.

In this regard, a DLC film is a film called an i-carbon film or an amorphous carbon hydride film (a—C: H), and also includes a hard carbon film. Further, a DLC film is an amorphous-state carbon film, and includes $SP^3$ bonding and $SP^2$ bonding. By forming this kind of DLC film on the inner wall surfaces of a plastic container, a container is obtained which can be used as a container for carbonated beverages and sparkling beverages.

The container of the disclosed invention described above is made to have (1) good transparency so that the foreign material inspection is not hindered, and (2) little oxygen permeability.

Further, Japanese Laid-Open Patent Publication No. HEI 11-70152 discloses a film and the like for medical containers, wherein a diamond state carbon film having a hydrogen concentration of 50 atomic % or less and an oxygen concentration of 2~20 atomic % is formed on at least one surface of a plastic film. Such film is a film that has transparency, oxygen barrier properties and water vapor barrier properties. This publication discloses embodiments related to polypropylene and polyethylene films which have superior water vapor barrier properties as prior art material properties, but through which it is easy for oxygen to permeate. The oxygen permeability of 25 μm biaxial oriented polypropylene is 17.3 ml/m$^2$/day. Further, the water vapor permeability is 4.5 g/m$^2$/day which is an improvement of barrier properties by a factor of about 2 or 3 times.

However, even this carbon film coated plastic container does not satisfy the requirements that in addition to the basic properties that there should be (1) good transparency so that the foreign material inspection is not hindered, and (2) no chemical reaction between the container and liquid contents, otherwise the compounding agents, there should also be (3) little water vapor permeability, and (4) little oxygen permeability, and the like.

The object of the present invention is to provide a liquid medicine plastic container having adaptability as a container filled with liquid medicine by forming a DLC film having appropriate composition, density and film thickness on the inner wall surfaces of the plastic container, and in particular to provide a plastic container which prevents quality deterioration of the effective components of the liquid medicine due to contamination with water vapor and oxygen, which prevents changes in the concentration of the effective components of the medicine due to the evaporation to the outside or the absorption of water which is a solvent, and which makes it possible to reduce the lowering of activity due to adsorption of the effective components of the medicine by the inner wall surfaces of the container and bonding with eluted material from the container.

The invention described in claim 1 is related to a plastic container for liquid medicine having a DLC (Diamond Like Carbon) film formed on the inner surfaces thereof, wherein said plastic container is formed to have a water vapor permeability of 0~0.006 g/container/day and an oxygen permeability of 0~0.011 ml/container/day when liquid medicine is sealed in said plastic container by appropriately changing the three conditions of composition, density and film thickness of said DLC film so that the atomic % of said DLC film is greater than or equal to 10 atomic % and less than 50 atomic %, the density of said DLC film is greater than 1.3 g/cm$^3$ and less than or equal to 2.1 cm$^3$, and the film thickness of said DLC film lies within the range 180~350 Å. In this way, because it is possible to provide a plastic container for liquid medicine having oxygen gas barrier properties and superior water vaporproof properties, it is possible to prevent quality deterioration due to oxygen contamination of the effective components of the liquid medicine, and it is possible to prevent changes in the concentration of the effective components of the medicine due to the absorption of water or the evaporation of water from the container.

In the present invention, the gas barrier properties are calculated per one container. Accordingly, the units "g/container/day" are used for the water vapor permeability, and the units "ml/container/day" are used for the oxygen permeability. The inner surface area of the "container" in these units is 400 cm$^2$/container, and in the case where the water vapor permeability and the oxygen permeability are converted per "inner surface area (m$^2$)" instead of per "container", the "container" in the units described above may be converted as "400 cm$^2$". Further more, because there is almost no gas permeation from the cover, the surface area thereof does not enter into consideration. Further, the thickness of the container uses 0.3 mm as a base. However, the present invention is not limited by the volume or shape of the container.

Because changes arise in the concentration of components due to evaporation of water which is a solvent, there has been a demand for containers or packaging agents having water vapor barrier properties. In particular, the blocking of water is required for water soluble medicines such as pilocarbine hydrochloride, sodium thiosulfate, sodium salicylate, diphenhydramine hydrochloride, choline bitartrate, salicylic acid and the like. The present invention makes it possible to provide a carbon film coated plastic container for medicine which is adapted for these medicines.

Further, the gas permeabilities of the nonpolar molecules nitrogen, oxygen and carbon dioxide for plastic are said to obey the general relationship 1:3.8:24.2 (Packaging Designs of Medicine, Masayasu Sugihara, Nanzando page 275). The carbon film coated plastic container of the present invention which has oxygen gas barrier properties also has carbon dioxide gas barrier properties in accordance with this general relationship.

The DLC film is formed from carbon atoms and hydrogen atoms, for example, polyethylene resin is also formed from the same atoms. However, in contrast with polyethylene which has both oxygen and water vapor permeabilities like other plastic resins, the carbon film coated container of the present invention has extremely low permeabilities for both of these gases. For these reasons, the present inventors presume the following. A DLC film having a large hydrogen content of 50 atomic % will have a density lowered to 1.2~1.3 g/cm$^3$, and the carbon atoms and hydrogen atoms will form a polymer state. At this time, because the DLC film has expansion properties, cracks will not form by the expansion of the container, but because this is not a dense film, it is presumed that it will be easy for oxygen and water to permeate through.

Generally, in a plasma CVD (Chemical Vapor Deposition) method, when the high-frequency applied electric power is raised, the negative self-bias becomes large, and when the negative self-bias becomes large, a dense film is possible and the density of the film becomes higher due to the acceleration of the impact of positive ions. Further, there is a tendency for the negative self-bias to become larger as the pressure is lowered at the time of film formation.

When the high-frequency applied electric power is lowered, because a sufficient bias will not be provided, the synthesized DLC film will include a large number of hydrogen and graphite-like SP$^2$ bonds, a spongy film will be formed, and the density of the film will also be small.

When the film thickness is too thin, the film will be patchy in a state where there are open holes, and the entire surface will not be covered. Further, when the film thickness becomes too thick, compressive stress occurs in the film itself, and this causes the film to crack and peel off.

Accordingly, the carbon film according to the present invention does not have gas barrier properties against oxygen and water vapor because it is a carbon film, and the present invention obtains these properties by appropriately changing the three conditions of composition, density and film thickness.

In this regard, the composition of the DLC film of the present invention is determined by the hydrogen atomic % and the carbon atomic %. Namely, theoretically due to the manufacturing conditions, it is possible for oxygen to be included as a structural atom other than hydrogen and carbon, but the amount thereof is extremely small. The oxygen atomic % is less than 0.2 atomic % (X-ray photoelectric spectral method, Model SSX-100 (manufactured by SSI Company)). Accordingly, in the DLC film of the present invention, if the hydrogen atomic % is 20 atomic %, the carbon atomic % is approximately 80 atomic %.

Further, because the density of the DLC film of the present invention means the apparent density, if the film composition is determined, the density is not necessarily determined. Namely, even for the same composition, if the deposition rate is changed, because the apparent density and denseness will change, this will have an effect on the gas barrier properties.

By appropriately changing these three conditions, the carbon film coated container of the present invention is obtained. In the present invention, the composition, density and film thickness of the DLC film are indicated for carrying out appropriate changes.

As described later in the example embodiments, from the viewpoint of the oxygen barrier properties, the three conditions of the DLC film are as follows. Namely, the composition condition is that the hydrogen atomic % is greater than or equal to 8 atomic %, and less than 50 atomic %, and preferably 10~40 atomic %. The density condition is 1.3~2.2 g/cm$^3$, and preferably 1.4~2.0 g/cm$^3$. The film thickness condition is 150~450 Å, and preferably 180~420 Å.

From the viewpoint of the water vapor barrier properties, the three conditions of the DLC film are as follows. Namely, the composition condition is that the hydrogen atomic % is greater than or equal to 10 atomic %, and less than 50 atomic %, and preferably 15~35 atomic %. The density condition is greater than 1.3 g/cm.$^3$ and less than or equal to 2.1 g/cm$^3$, and preferably 1.7~2.0 g/cm$^3$. The film thickness condition is 180~350 Å, and preferably 200~320 Å.

Accordingly, in order to obtain a plastic container for liquid medicines equipped with both oxygen barrier properties and water vapor barrier properties, this is achieved by establishing the three conditions of the DLC film as follows. Namely, the composition condition is that the hydrogen atomic % is greater than or equal to 10 atomic %, preferably 15~35 atomic %. The density condition is greater than 1.3 g/cm$^3$ and less than or equal to 2.1 g/cm$^3$, and preferably 1.7~2.0 g/cm$^3$. The film thickness condition is 180~350 Å, and preferably 200~320 Å.

At this time, a plastic container for liquid medicine can be obtained such that the water vapor permeability is 0~0.006 g/container/day, and the oxygen permeability is 0~0.011 ml/container/day in the plastic container having a DLC film formed on the inner surfaces thereof.

The invention described in claim 2 is the plastic container for liquid medicine having a DLC film formed on the inner surfaces thereof described in claim 1, wherein the inner wall surfaces of the plastic container are formed to have low adsorptivity for effective components of the medicine by appropriately changing the three conditions of composition, density and film thickness of said DLC film. In this way, it is possible to provide a plastic container for liquid medicine having oxygen gas barrier properties, water vapor barrier properties and low adsorptivity of effective components of medicine. In this regard, by suppressing adsorption to the inner wall surfaces of the medicine container, there is the result that it is possible to efficiently remove the effective components when the medicine is removed from the container.

From the viewpoint of the low adsorptivity of effective components of medicine, the three conditions of the DLC film are as follows. Namely, the composition condition is that the hydrogen atomic % is greater than or equal to 8 atomic % and less than 45 atomic %, and preferably 8~26 atomic %. The density condition is greater than 1.3 g/cm$^3$ and less than or equal to 2.2 g/cm$^3$, and preferably 1.8~2.2 g/cm$^3$. The film thickness condition is 100~450 Å, and preferably 100~400 Å.

The reasons for establishing such three conditions of the DLC film are unclear, but the present inventors presume that with regards to the composition condition, because a diamond structure or the like increases by atomic units when the hydrogen atomic % is small, the wettability is also lowered, and the physical adsorption of effective components of medicine also becomes less. Further, chemical adsorption arises because of ionic reactions between the amino group or carboxyl group of proteins and the minute amount of electric charge portions existing on the plastic, and when the hydrogen atomic % is small, it is thought that the electric charge portions of the DLC film become small, whereby chemical adsorption becomes less. There is thought to be a proportional relationship between the density conditions and the hydrogen atomic % when the true density and the apparent density are close. For this reason, when the density is high, the physical and chemical adsorption of effective components of medicine are also thought to become less for the same reasons described above. As for the film thickness condition, because plastic resin portions of the container will be in an exposed state not covered by the DLC film when there is no minimum film thickness, and on the other hand because cracks will arise in the DLC by the residual stress inside the DLC film when the film thickness is large, the effective components of medicine are thought to be adsorbed onto the plastic resin portions of the inside surfaces of the container by the capillary suction force from such openings.

Accordingly, from the viewpoint of satisfying all the oxygen barrier properties, the water vapor barrier properties and the low adsorptivity of effective components of medicine, the three conditions of the DLC film are as follows. Namely, the composition condition is that the hydrogen atomic % is 10~35 atomic %, and preferably 15~26 atomic %. The density condition is 1.6~2.1 g/cm$^3$, and preferably 1.8~2.0 g/cm$^3$. The film thickness condition is 180~350 Å, and preferably 200~320 Å.

The invention described in claim 3 is the plastic container for liquid medicine described in claim 1 or claim 2, wherein the inner wall surfaces of the plastic container are formed to have a high maintenance percentage for the activity of effective components of the medicine. In order to have a high maintenance percentage for the activity of effective components of the medicine, in addition to suppressing the adsorption of effective components onto the inner wall surfaces of the container as described above, this is achieved by suppressing the elution of material into the medicine from the container material. Accordingly, because the DLC film formed on the inside surfaces of the container of the present invention has low adsorptivity of effective components of medicine and properties which prevent eluted materials from permeating through, the present invention provides a superior container of medicines and the like. Heparin (polysaccharide) is used to prevent blood from coagulating during an intravenous drip or artificial dialysis for the treatment of a kidney disease. At this time, the heparin solution is diluted, placed in a plastic syringe (approximately 50 ml), or placed in a plastic container for storage. The tubes connecting machines are also made of plastic. There are cases where the activity of heparin is lowered by these syringes, storage containers and tubes. This is caused by the adsorption of heparin onto the plastic and the elution of material from the plastic. Said carbon film coated plastic container for medicine makes it possible to suppress the adsorption of effective components of medicine to a minimum, and makes it possible to suppress the elution of unreacted low molecular substances and the like of plastic into the contents to a minimum.

Because regulations require eye drop medicine and transport liquid to be "formulations manufactured sterilely", the end product must be sterilized or each process must be made completely sterile. Naturally, the container also undergoes high pressure steam sterilization or gas sterilization by ethylene oxide (EO). The problems of the case where the container undergoes EO sterilization are that EO gas remains on the container, EO gas elutes into the liquid, and EO gas reacts with the liquid components. Said carbon film coated plastic container for medicine makes it possible to suppress elution into the contents to a minimum even when, for example, EO gas remains on the container.

The invention described in claim 4 is the plastic container for liquid medicine described in any one of claims 1~3, wherein the medicine is a protein, a peptide or a glycoprotein. As for the form of the liquid medicine, the liquid agent is not limited to formulations, and also includes the case of source materials. The plastic container for liquid medicine of the present invention can be used even for the case where a source material of an intermediate step for forming a formulation is stored and transported. These proteins, peptides and glycoproteins are manufactured by DNA recombination, a cell culture method or the separation of human blood plasma components or the like.

The plastic container of the present invention is suited for use as a container of medicines manufactured by DNA recombination, namely, medicines such as tissue plasminogen activators (TPA), B-type hepatitis vaccine, interferon, interleukin, erythropoietin, granular colony stimulation factor (G-CSF), human growth hormone, insulin like growth factor I, human insulin, blood serum albumin, a trial sodium diuretic peptide and the like.

The plastic container of the present invention is suited for use as a container of medicines manufactured by cell culture medicine, namely, medicines such as interferon, monoclonal antibodies, B-type hepatitis vaccine and the like.

The plastic container of the present invention is suited for use as a container of medicines manufactured by blood plasma separated agent medicine, namely, medicines such as albumin, globulin, coagulation-type VIII factor, coagulation-type IX factor and the like.

Medicines which are in the form of a liquid agent are oral agents and injection agents (including the transport liquid). For example, in the transport liquid, there are nutrition agents such as glucide solutions (glucose, maltose), high calorie agents, amino acid solutions, fat emulsions, and enteral nutrition agents, and there are body fluid and body fluid component formulations such as blood plasma separated agents (albumin (human blood corpuscles)), globulin formulations (anti-IgG), coagulation factor formulations (VIII factor), electrolytic formulations (physiological saline solution, Ringer's solution), blood plasma substitute agents (dextran), and mineral formulations (sodium chloride).

In the medicine components described above, proteins such as albumin, globulin and blood coagulation factor VIII and the like are generally physically and chemically adsorbed (sorbed) onto plastic. When this happens, the percentage of effective components recovered from the container decreases, and there arises the denaturation and a lowering of activity. Physical adsorption occurs because of hydrophobic bonding, van der Waals bonding and the like. Chemical adsorption arises because of ionic reactions between the amino group or carboxyl group of proteins and the minute amount of electric charge portions existing on the plastic. This adsorption is not limited to proteins, and arises in strongly polar compounds even in low molecular medicines.

The following are protein medicines that include an enzyme. Namely, such medicines include tissue plasminogen activators (TPA), B-type hepatitis vaccine, interferon, interleukin, erythropoietin, granular colony stimulation factor (G-CSF), human growth hormone, insulin like growth factor I, human insulin, blood serum albumin, atrial sodium diuretic peptide, monoclonal antibodies, B-type hepatitis vaccine and the like. These medicines are manufactured by a cell culture, a recombinant DNA method or the separation of human blood plasma components (urokinase, albumin, globulin). These have been used even as solid agents, but in most cases they have been used as liquid agents and injection agents.

The description given above demonstrates the function of the present invention that makes it difficult for the effective components of medicine to be adsorbed.

The invention described in claim 5 is the plastic container for liquid medicine described in any one of claims 1~4, wherein the plastic container is formed by polyethylene terephthalate resin.

As for the plastic, polyethylene terephthalate resin, polyethylene resin, polypropylene resin, polystyrene resin, cycloolefin copolymer resin, polyethylene naphthalate resin, ethylene-vinyl alcohol copolymer resin, poly-4-methylpentene-1 resin, polymethyl methacrylate resin, acrylonitrile resin, polyvinyl chloride resin, polyvinylidene chloride resin, acrylonitrile-styrene resin, acrylonitrile-butadiene-styrene resin, polyamide resin, polyamide-imide resin, polyacetal resin, polycarbonate resin, polybutylene terephthalate resin, ionomer resin, polysulfone resin, or ethylene tetrafluoride resin may be used, but polyethylene terephthalate is more preferred, and when a DLC film is formed on a container made of polyethylene terephthalate, the container will exhibit superior properties.

In accordance with the present invention, by making particularly appropriate changes of the three conditions of the composition, density and film thickness of the DLC film, because the solvent in which the effective components of the medicine are dissolved does not escape to the outside of the container and does not become contaminated with water vapor from the outside of the container, it is possible to provide a plastic container which makes it possible to maintain the concentration at a fixed value. The oxidation of effective components of medicine due to oxygen permeating in from the outside of the container becomes difficult to occur. Further, preferably, because it is possible to remove the medicine from the container at a high probability without the effective components of the medicine adsorbing to the inner wall surfaces of the container, it is possible to effectively use the effective components of the medicine. Furthermore, preferably, because the medicine does not become contaminated by impurities such as plasticizers and the like from the plastic material forming the plastic container, there is little lowering of the activity of the effective components of the medicine.

Figure 1:
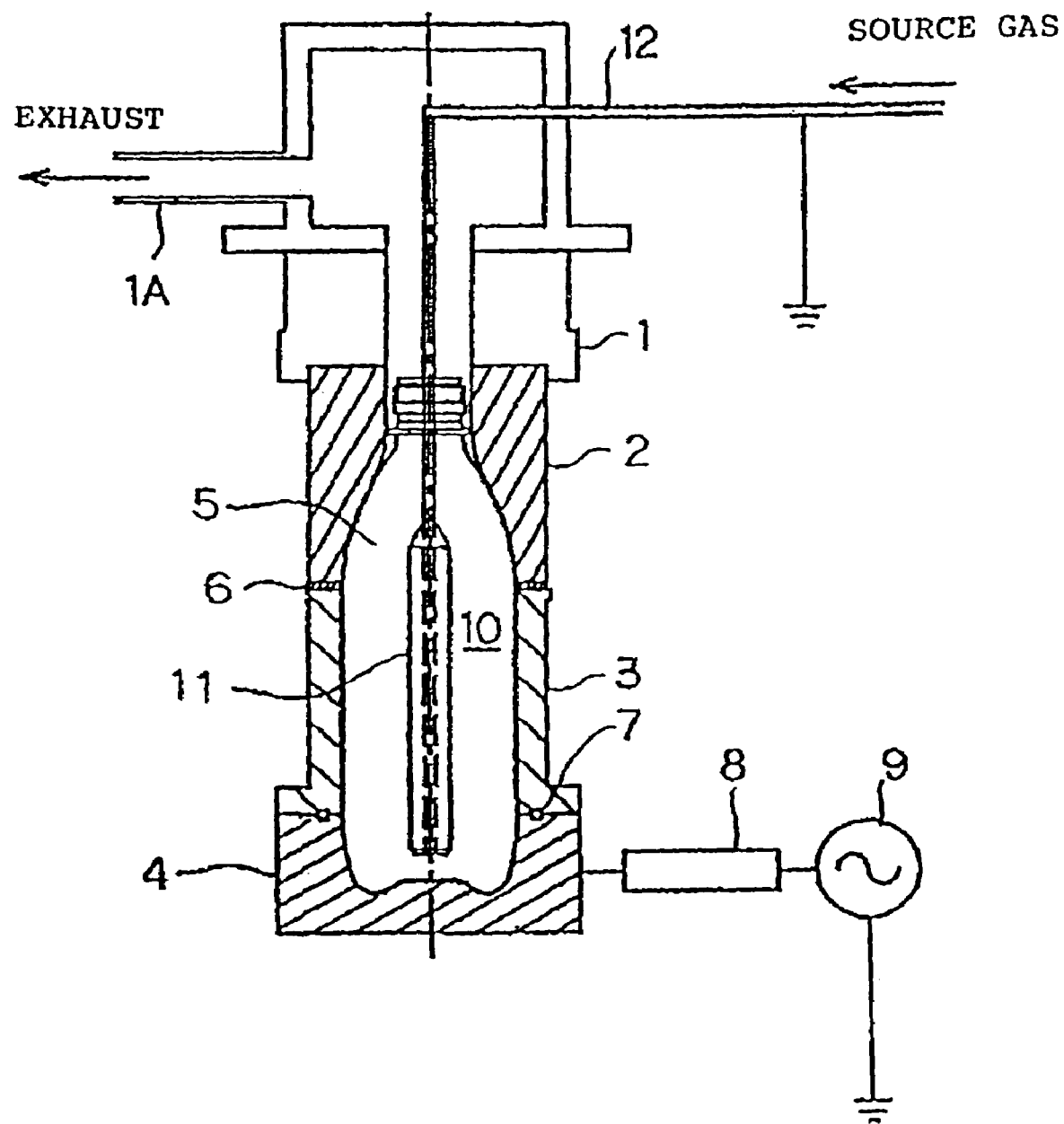
FIG. 1 is a drawing showing one example of a manufacturing apparatus for manufacturing the plastic container for liquid medicines according to the present invention.

The applied symbols in FIG. 1 have the following meanings: 1 is a base, 1A is an exhaust outlet, 2 is a shoulder portion electrode, 3 is a body portion electrode, 4 is a bottom portion electrode, 5 is a plastic container, 6 is an insulator, 7 is an O-ring, 8 is an interface device, 9 is a high-frequency oscillator, 10 is a housing portion, 11 is an inner electrode, and 12 is a pipeline.

PREFERRED EMBODIMENTS OF THE INVENTION

First, a description will be given for the manufactured embodiments of a carbon film coated plastic container of the present invention.

FIG. 1 is a drawing showing the electrode structure and the like of the present apparatus. As shown in FIG. 1, the present apparatus is equipped with a base 1, a shoulder portion electrode 2 and a body portion electrode 3 mounted to the base 1, and a bottom portion electrode 4 which can be connected to and disconnected from the body portion electrode 3. As shown in FIG. 1, the shoulder portion electrode 2, the body portion electrode 3 and the bottom portion electrode 4 each have inner wall surfaces shaped like the outer shape of a plastic container 5, in which the shoulder portion electrode 2 is arranged along the shoulder portion of the plastic container 5, the body portion electrode 3 is arranged along the body portion of the plastic container 5, and the bottom portion electrode 4 is arranged along the bottom portion of the plastic container 5. The shoulder portion electrode 2, the body portion electrode 3 and the bottom portion electrode 4 form the outer electrodes of the present apparatus.

When the bottom portion electrode 4 is mounted to the body portion electrode 3, the base 1, the shoulder portion electrode 2, the body portion electrode 3 and the bottom portion electrode 4 form a mutually airtight mounted state, and these function as a vacuum chamber equipped with a housing portion 10 for housing the plastic container 5.

As shown in FIG. 1, an insulator 6 is provided between the shoulder portion electrode 2 and the body portion electrode 3, and in this way the shoulder portion electrode 2 and the body portion electrode 3 are electrically insulated from each other. Further, an O-ring 7 is provided between the body portion electrode 3 and the bottom portion electrode 4, and when the bottom portion electrode 4 is mounted, a small gap is formed between the bottom portion electrode 4 and the body portion electrode 3. In this way, while ensuring airtightness between the bottom portion electrode 4 and the body portion electrode 3, electrical insulation is carried out between both electrodes.

An inner electrode 11 is provided in the housing portion 10, and the inner electrode 11 is inserted into the inside of the plastic container 5 housed inside the housing portion 10. The inner electrode 11 is electrically connected to a ground potential.

The inner electrode 11 is formed to have a hollow shape (tube shape), and one blowout hole (not shown in the drawing) which communicates the inside and the outside of the inner electrode 11 is formed in the lower end thereof. Further, instead of providing a blowout hole in the lower end, a plurality of blowout holes (not shown in the drawing) may be formed to pass through the inside and the outside of the inner electrode 11 in the radial direction. A pipeline 12 which communicates with the inside of the inner electrode 11 is connected to the inner electrode 11, and this structure makes it possible for a source gas fed into the inside of the inner electrode 11 via the pipeline 12 to be emitted into the inside of the plastic container 5 via the blowout hole. Further, the pipeline 12 is made of metal and has electrical conductivity, and as shown in FIG. 1, the pipeline 12 is used to connect the inner electrode 11 to a ground potential. Further, the inner electrode 11 is supported by the pipeline 12.

As shown in FIG. 1, the output terminal of a high-frequency oscillator 9 is connected to the bottom portion electrode 4 via an interface device 8. The high-frequency oscillator 9 generates a high-frequency voltage between itself and the ground potential, and in this way a high-frequency voltage is applied between the inner electrode 11 and the bottom portion electrode 4.

Next, a description will be given for the process when a DLC (Diamond Like Carbon) film is formed on the inner wall surfaces of the plastic container 5 using the present apparatus.

The plastic container 5 is set so that the bottom portion thereof makes contact with the inner surface of the bottom portion electrode 4, and by raising the bottom portion electrode 4, the plastic container 5 is housed in the housing portion 10. At this time, the inner electrode 11 provided in the housing portion 10 is inserted inside the plastic container 5 through the orifice (upper end opening) of the plastic container 5.

When the bottom portion electrode 4 is raised to a prescribed position to hermetically seal the housing portion 10, a state is formed in which the outer periphery of the plastic container 5 makes contact with the inner surfaces of the shoulder portion electrode 2, the body portion electrode 3 and the bottom portion electrode 4. Next, the air inside the housing portion 10 is exhausted through an exhaust outlet 1A of the base 1 by a vacuum device not shown in the drawing. After the pressure inside the housing portion 10 has been reduced to a required vacuum level, a source gas (e.g., carbon source gases such as aliphatic hydrocarbons, aromatic hydrocarbons and the like) supplied via the pipeline 12 is introduced into the inside of the plastic container 5 from the blowout hole of the inner electrode 11.

After the concentration of the source gas reaches a prescribed value, the high-frequency oscillator 9 (e.g., 13.56 MHz) is activated to apply a high-frequency voltage between the inner electrode 11 and the outer electrodes, whereby a plasma is generated inside the plastic container 5. In this way, a DLC film is formed on the inner wall surfaces of the plastic container 5.

Namely, the formation of a DLC film on the inner wall surfaces of the plastic container 5 is carried out by a plasma CVD method, wherein electrons accumulate on the inner wall surfaces of the outer electrodes insulated by the plasma generated between the outer electrodes and the inner electrode 11, and a prescribed fall in potential occurs.

In this way, the carbon and the hydrogen of the hydrocarbon that forms the source gas present in the plasma are each ionized to positive. Then, due to the attractive electrostatic force between the ions and the electrons accumulated on the inner wall surfaces, the ions will be attracted by and randomly collide with the inner wall surface of the plastic container 5 running along the inner wall surfaces of the outer electrodes, whereby an extremely dense hard carbon film made from DLC is formed on the inner wall surface of the plastic container 5 by the bonding between adjacent carbon atoms and the bonding between carbon atoms and hydrogen atoms, and by the breaking of bonds of hydrogen atoms that have bonded once (sputtering effect).

As described above, the output terminal of the high-frequency oscillator 9 is connected to only the bottom portion electrode 4. Further, a gap is formed between the bottom portion electrode 4 and the body portion electrode 3, and the bottom portion electrode 4 and the body portion electrode 3 are electrically insulated from each other. Furthermore, the insulator 6 is provided between the body portion electrode 3 and the shoulder portion electrode 2, and the body portion electrode 3 and the shoulder portion electrode 2 are electrically insulated from each other. Accordingly, the high-frequency electric power applied to the body portion electrode 3 and the shoulder portion electrode 2 becomes smaller than the high-frequency electric power applied to the bottom portion electrode 4. However, because capacity coupling is carried out through the respective gaps between the bottom portion electrode 4 and the body portion electrode 3, and between the body portion electrode 3 and the shoulder portion electrode 2, a certain degree of high-frequency electric power is also applied to the body portion electrode 3 and the shoulder portion electrode 2.

In general, the bottom portion of plastic containers such as bottles and the like have complex shapes, and it is difficult to form a DLC film having a uniform film thickness, composition and density. For this reason, even after the DLC film is formed, the gas barrier properties of the bottom portion of the container are prone to lowering.

In contrast with this, by means of the manufacturing apparatus of the embodiment described above, because it is possible to apply high-frequency electric power larger than that for the body portion and shoulder portion to the bottom portion of the plastic container, it is possible to uniformly form a DLC film having a prescribed film thickness, composition and density on the entire bottle, and it is possible to effectively improve the gas barrier properties for the entire container. In the embodiment described above, the applied electric power was 800~1400W.

In the embodiment described above, the shoulder portion electrode 2, the body portion electrode 3 and the bottom portion electrode 4 are constructed so as to be completely insulated against direct current, but it is also possible to connect each of the electrodes to each other by resistance or capacitive elements or the like. In short, so long as it is possible to apply high-frequency electric power having a required strength in accordance with each portion of the container, for example, a plurality of high-frequency oscillators may be provided to apply high-frequency electric power separately to each of the electrodes of the shoulder portion electrode 2, the body portion electrode 3 and the bottom portion electrode 4, or the output of a single high-frequency oscillator may be connected to each of the electrodes via a plurality of interface devices.

In the embodiment described above, an example was described for the case where the outer electrodes are divided into three portions, but the outer electrodes may be divided into two portions, or the outer electrodes may be divided into four or more portions.

Further, in the embodiment described above, a description was given for a container having a shape that makes it difficult to form a DLC film on the bottom portion, but by adjusting the distribution of the applied high-frequency electric power in accordance with the shape of the container, it is possible to form a good DLC film over the entire container.

Accordingly, in the case of container shapes that make it easy to form a DLC film on the bottom portion, it is possible to form a good DLC film over the entire container by adjusting the distribution of applied high-frequency electric power without dividing the outer electrodes.

In the embodiment described above, a description was given for manufacturing based on a high-frequency plasma CVD method. In the embodiment described above, it is possible to form a DLC film having a prescribed composition, density and film thickness as far as the bottom portion even for bottles having complex shapes. By adjusting such formation conditions to the three conditions mentioned in the example embodiments described below, it is possible to achieve the invention of a carbon film coated plastic container having prescribed properties, namely, in addition to the basic properties of (1) good transparency so that the foreign material inspection is not hindered, and (2) no chemical reaction between the container and liquid contents, otherwise the compounding agents, other properties such as (3) barrier properties against odor components, (4) barrier properties against organic solvent vapor, (5) little water vapor permeability, and (6) little oxygen permeability, and the like.

However, the method of forming the DLC film is not limited to the method of the embodiment described above. For example, a DLC film may be formed by a manufacturing apparatus based on a microwave plasma CVD method or the like.

EXAMPLE EMBODIMENTS

In the example embodiments, 500 ml PET containers (weight 30 g, thickness 0.3 mm) were prepared in accordance with the principle of the present invention, and the inner surface area of these containers was 400 $cm^2$/container. Accordingly, the gas barrier properties are calculated per one container. In the case where these are converted per unit surface area ($m^2$), conversion may be carried out by considering the inner surface area of the container used for evaluation. Further, because there is almost no gas permeation from the cover, the surface area thereof does not enter into consideration. However, the present invention is not limited by the volume or shape of the containers of the example embodiments. Further, the PET containers were formed using polyethylene terephthalate resin (Nihon Yunipet (Inc.) RT543 (Intrinsic Viscosity 0.77)).

Method of Analysis (1) Measurement of Film Thickness
Thickness was measured by Tenchol Company's alpha-step500 tracer type difference meter.

(2) Surface Area
Measurement was carried out by CAD from the bottle drawing. There was approximately 400 $cm^2$ per one container.

(3) Measurement of Film Weight
The PET bottles were shredded, flakes were placed in a beaker, a reaction with 4% NaOH at normal temperature was carried out for 10 hours, and the DLC film was peeled off. This solution was filtered by a milli-pore filter (pore diameter 0.5μ) made of polytetrafluoroethylene, drying was carried out at 105° C., and the weight of the DLC film was calculated from the weights before and after filtering. Because the alkaline solution remains as an impurity, the blank value of the alkaline solution was also calculated, and the weight of the DLC film was corrected.

(4) Measurement of Film Density
The density was calculated from Equation 1.

Density=Weight÷(Surface Area×Thickness)   Equation 1

(5) Measurement of Hydrogen Atomic Content of Film
The hydrogen atomic % (percentage of the number of hydrogen atoms) of the DLC film was measured[1] using a Shimadzu IBA-9900EREA (elastic recoil detection analysis, elastic recoil particle detection method).

1) A. Kimura, Y. Nakatani, K. Yamada, T. Suzuki, Diamond Relat. Mater. 8 (1999) 37.

(6) Oxygen Permeability
Measurements were made using an Oxtran manufactured by Modem Control Company under the conditions 22° C.×60% RH.

(7) Water Permeability

Measurements were made using an Oxtran manufactured by Modem Control Company under the conditions 40° C.×90% RH.

Example Embodiments for Comparing Oxygen and Water Vapor Permeabilities of Carbon Film Coated Containers Example Embodiment 1

Using the apparatus described above, a DLC film was formed on the inner surfaces of a 500 ml PET container with acetylene gas as the source material. Table 1 shows the conditions for forming the DLC film in the present invention. Table 2 shows the various physical properties of the containers depending on the film thickness, density and composition (indicated by the hydrogen content) corresponding to the example embodiments of Table 1. The coating conditions were established as mentioned in Example Embodiment 1 of Table 1. The film thickness, density and composition of Example Embodiment 1 and the physical property values of the film thereof are shown in Table 2.

Example Embodiments 2~19

In the same manner, the film thickness, density and composition of the formed DLC film was changed to establish the example embodiments 2~19 of Table 1. The various physical properties of the containers at such time are shown in the same manner in Table 2.

Reference Examples 1~13

DLC films were formed by shifting the conditions of the reference examples from the three conditions of film thickness, density and composition of the DLC films of the example embodiments. The coating conditions were established like the reference examples 1~13 of Table 1. The various physical properties of the containers at such time are shown in the same manner in Table 2.

Blank Space Below

TABLE 1

| Example Embodiments | Discharge Method | High-Frequency Electric Power w | Film Forming Pressure torr | Gas Flow Rate sccm | Thickness Å | Density g/cm³ | Hydrogen Atomic % |
|---|---|---|---|---|---|---|---|
| Example Embodiment 1 | Bottom | 800 | 0.05 | 31 | 180 | 1.6 | 40 |
| Example Embodiment 2 | Bottom | 800 | 0.05 | 31 | 350 | 1.6 | 40 |
| Example Embodiment 3 | Bottom | 1200 | 0.05 | 31 | 180 | 2.1 | 10 |
| Example Embodiment 4 | Bottom | 1200 | 0.05 | 31 | 350 | 2.1 | 10 |
| Example Embodiment 5 | Bottom | 900 | 0.05 | 31 | 200 | 1.7 | 30 |
| Example Embodiment 6 | Bottom | 900 | 0.05 | 31 | 320 | 1.7 | 30 |
| Example Embodiment 7 | Bottom | 1200 | 0.05 | 31 | 200 | 2.0 | 15 |
| Example Embodiment 8 | Bottom | 1200 | 0.05 | 31 | 320 | 2.0 | 15 |
| Example Embodiment 9 | Bottom | 900 | 0.05 | 31 | 220 | 1.6 | 35 |
| Example Embodiment 10 | Bottom | 900 | 0.05 | 31 | 350 | 1.6 | 35 |
| Example Embodiment 11 | Bottom | 1200 | 0.03 | 31 | 220 | 2.1 | 10 |
| Example Embodiment 12 | Bottom | 1200 | 0.03 | 31 | 350 | 2.1 | 10 |
| Example Embodiment 13 | Bottom | 900 | 0.05 | 31 | 250 | 1.7 | 30 |
| Example Embodiment 14 | Bottom | 1200 | 0.05 | 31 | 250 | 2.0 | 10 |
| Example Embodiment 15 | Bottom | 900 | 0.05 | 31 | 320 | 1.7 | 30 |
| Example Embodiment 16 | Bottom | 1200 | 0.05 | 31 | 320 | 2.0 | 10 |
| Example Embodiment 17 | Bottom | 1000 | 0.07 | 31 | 270 | 1.8 | 26 |
| Example Embodiment 18 | Bottom | 900 | 0.05 | 31 | 300 | 1.6 | 35 |
| Example Embodiment 19 | Bottom | 1000 | 0.07 | 31 | 300 | 1.8 | 26 |
| Reference Example 1 | Bottom | 800 | 0.07 | 31 | 150 | 1.3 | 45 |
| Reference Example 2 | Bottom | 1300 | 0.03 | 31 | 450 | 2.2 | 8 |
| Reference Example 3 | Bottom | 1300 | 0.03 | 31 | 400 | 2.2 | 8 |
| Reference Example 4 | Bottom | 1100 | 0.05 | 31 | 100 | 1.9 | 20 |
| Reference Example 5 | Bottom | 1100 | 0.05 | 31 | 500 | 1.9 | 20 |
| Reference Example 6 | Bottom | 800 | 0.07 | 31 | 300 | 1.2 | 48 |
| Reference Example 7 | Bottom | 1400 | 0.03 | 31 | 250 | 2.3 | 6 |
| Reference Example 8 | Bottom | 1300 | 0.03 | 31 | 50 | 2.2 | 8 |
| Reference Example 9 | Bottom | 1300 | 0.03 | 31 | 100 | 2.2 | 8 |
| Reference Example 10 | Bottom | 1300 | 0.03 | 31 | 300 | 2.2 | 8 |
| Reference Example 11 | Bottom | 800 | 0.07 | 31 | 450 | 1.3 | 45 |
| Reference Example 12 (Only PET) | Bottom | — | — | 31 | 0 | — | — |
| Reference Example 13 (Only PP) | Bottom | — | — | 31 | 0 | — | — |

TABLE 2

| Example Embodiments | Thickness Å | Density g/cm³ | Composition Hydrogen Atomic % | Permeability and Evaluation | | | | | |
|---|---|---|---|---|---|---|---|---|---|
| | | | | Oxygen | | Water Vapor | | Ethanol | |
| | | | | ml/container/day | Evaluation | g/container/day | Evaluation | g/container/month | Evaluation |
| Example Embodiment 1 | 180 | 1.6 | 40 | 0.004 | ○ | 0.006 | ○ | 0.12 | X |
| Example Embodiment 2 | 350 | 1.6 | 40 | 0.004 | ○ | 0.006 | ○ | 0.10 | X |
| Example Embodiment 3 | 180 | 2.1 | 10 | 0.007 | ○ | 0.005 | ○ | 0.11 | X |
| Example Embodiment 4 | 350 | 2.1 | 10 | 0.006 | ○ | 0.006 | ○ | 0.05 | ○ |
| Example Embodiment 5 | 200 | 1.7 | 30 | 0.004 | ⊙ | 0.003 | ⊙ | 0.10 | X |
| Example Embodiment 6 | 320 | 1.7 | 30 | 0.004 | ⊙ | 0.003 | ⊙ | 0.02 | ⊙ |
| Example Embodiment 7 | 200 | 2.0 | 15 | 0.003 | ⊙ | 0.003 | ⊙ | 0.09 | X |
| Example Embodiment 8 | 320 | 2.0 | 15 | 0.003 | ⊙ | 0.003 | ⊙ | 0.03 | ⊙ |
| Example Embodiment 9 | 220 | 1.6 | 35 | 0.004 | ⊙ | 0.006 | ○ | 0.04 | ○ |
| Example Embodiment 10 | 350 | 1.6 | 35 | 0.004 | ⊙ | 0.006 | ○ | 0.05 | ○ |
| Example Embodiment 11 | 220 | 2.1 | 10 | 0.005 | ○ | 0.005 | ○ | 0.04 | ○ |
| Example Embodiment 12 | 350 | 2.1 | 12 | 0.006 | ○ | 0.006 | ○ | 0.03 | ⊙ |
| Example Embodiment 13 | 250 | 1.7 | 30 | 0.004 | ⊙ | 0.003 | ⊙ | 0.02 | ⊙ |
| Example Embodiment 14 | 250 | 2.0 | 10 | 0.003 | ⊙ | 0.004 | ○ | 0.04 | ○ |
| Example Embodiment 15 | 320 | 1.7 | 30 | 0.003 | ⊙ | 0.002 | ⊙ | 0.02 | ⊙ |
| Example Embodiment 16 | 320 | 2.0 | 10 | 0.003 | ⊙ | 0.004 | ○ | 0.05 | ○ |
| Example Embodiment 17 | 270 | 1.8 | 26 | 0.002 | ⊙ | 0.002 | ⊙ | 0.01 | ⊙ |
| Example Embodiment 18 | 300 | 1.6 | 35 | 0.003 | ⊙ | 0.006 | ○ | 0.04 | ○ |
| Example Embodiment 19 | 300 | 1.8 | 26 | 0.002 | ⊙ | 0.003 | ⊙ | 0.02 | ⊙ |
| Reference Example 1 | 150 | 1.3 | 45 | 0.008 | ○ | 0.012 | X | 0.09 | X |
| Reference Example 2 | 450 | 2.2 | 8 | 0.011 | ○ | 0.011 | X | 0.10 | X |
| Reference Example 3 | 400 | 2.2 | 8 | 0.008 | ○ | 0.013 | X | 0.11 | X |
| Reference Example 4 | 100 | 1.9 | 20 | 0.019 | X | 0.014 | X | 0.11 | X |
| Reference Example 5 | 500 | 1.9 | 20 | 0.024 | X | 0.015 | X | 0.12 | X |
| Reference Example 6 | 300 | 1.2 | 48 | 0.028 | X | 0.015 | X | 0.13 | X |
| Reference Example 7 | 250 | 2.3 | 6 | 0.025 | X | 0.018 | X | 0.12 | X |
| Reference Example 8 | 50 | 2.2 | 8 | 0.029 | X | 0.017 | X | 0.16 | X |
| Reference Example 9 | 100 | 2.2 | 8 | 0.023 | X | 0.015 | X | 0.14 | X |
| Reference Example 10 | 300 | 2.2 | 8 | 0.010 | ○ | 0.012 | X | 0.16 | X |
| Reference Example 11 | 300 | 1.3 | 45 | 0.011 | ○ | 0.011 | X | 0.11 | X |
| Reference Example 12 (Only PET) | 0 | — | — | 0.033 | X | 0.020 | X | 0.19 | X |
| Reference Example 13 (Only PP) | 0 | — | — | 1.05 | X | 0.006 | ○ | 0.68 | X |

From the viewpoint of the oxygen barrier properties, the three conditions of the DLC film are as follows. Namely, the composition condition is that the hydrogen atomic % is 8~45 atomic %, and preferably 10~40 atomic %. The density condition is 1.3~2.2 g/cm³, and preferably 1.4~2.0 g/cm³. When the film thickness is too thin, the film will be patchy in a state where there are open holes, and the entire surface will not be covered. Further, when the film thickness becomes too thick, compressive stress occurs in the film itself, and this causes the film to crack and peel off. Accordingly, the film thickness condition is 150~450 Å, and preferably 180~420 Å.

From the viewpoint of the water vapor barrier properties, the three conditions of the DLC film are as follows. Namely, the composition condition is that the hydrogen atomic % is 10~40 atomic %, and preferably 15~35 atomic %. The density condition is 1.6~2.1 g/cm³, and preferably 1.7~2.0 g/cm³. The film thickness condition is 180~350 Å, and preferably 200~320 Å.

Accordingly, in order to obtain a plastic container for liquid medicines equipped with both oxygen barrier properties and water vapor barrier properties, this is achieved by establishing the three conditions of the DLC film as follows. Namely, the composition condition is that the hydrogen atomic % is 10~40 atomic %, and preferably 15~35 atomic %. The density condition is 1.6~2.1 g/cm³, and preferably 1.7~2.0 g/cm³. The film thickness condition is 180~350 Å, and preferably 200~320 Å. At this time, the gas barrier properties of the carbon film coated containers of the present invention were such that the water vapor permeability was 0~0.006 g/container/day, and the oxygen permeability was 0~0.01 ml/container/day.

Example Embodiments for Comparing Oxygen Permeability and Water Vapor Permeability of DLC Films Formed on Plastic Films According to Japanese Laid-Open Patent Publication No. HEI 11-70152, a diamond state carbon film having a hydrogen concentration of 50 atomic % or less and an oxygen concentration of 2~20 atomic % is introduced. The oxygen permeability of 25 μm biaxial oriented polypropylene is 17.3 ml/m²/day, and the water vapor permeability is 4.5 g/m²/day which is an improvement of barrier properties by a factor of about 2 or 3 times. The inner surfaces of PET containers were covered by a 12 μm thick PET film, and the film obtained by forming a DLC film under the conditions of Example Embodiment 15 of Table 1 formed Example Embodiment 20, and the film obtained by forming a DLC film under the conditions of 17 of Table 1 formed Example Embodiment 21, and the various physical properties of these films are shown in Table 3. As for the 12 μm PET films of the present invention, as shown in Example Embodiments 20, 21 of Table 3, in contrast with the films not formed with a DLC film, the oxygen gas barrier properties were about 100 times better, and the water vapor permeability was about 30 times better.

TABLE 3

| Example Embodiment | Film Thickness Å | Density g/cm³ | Composition Hydrogen Atom Content Hydrogen Atomic % | Permeability Oxygen ml/m²/Day | Permeability Water g/m²/Day |
|---|---|---|---|---|---|
| Reference Example 14 (PET12 μm) | 0 | — | — | 85 | 45 |
| Reference Example 15 (PET12 μm) | 0 | — | — | 100 | 50 |
| Example Embodiment 20 | 200 | 1.7 | 30 | 1.0 | 2.0 |
| Example Embodiment 21 | 250 | 1.8 | 26 | 0.8 | 1.5 |

Example Embodiments for Comparing the Adsorption of Effective Components of Medicine of Carbon Film Coated Containers The adsorption of effective components of medicine was measured for DLC film coated containers manufactured under the conditions of Table 4.

Blank Space Below

TABLE 4

| Example Embodiments | Discharge Method | High-Frequency Electric Power w | Film Forming Pressure torr | Gas Flow Rate sccm | Thickness Å | Density g/cm³ | Hydrogen Atomic % |
|---|---|---|---|---|---|---|---|
| Example Embodiment 22 | Bottom | 900 | 0.05 | 31 | 300 | 1.6 | 35 |
| Example Embodiment 23 | Bottom | 1000 | 0.07 | 31 | 300 | 1.8 | 26 |
| Example Embodiment 24 | Bottom | 1300 | 0.03 | 31 | 450 | 2.2 | 8 |
| Example Embodiment 25 | Bottom | 1300 | 0.03 | 31 | 400 | 2.2 | 8 |
| Example Embodiment 26 | Bottom | 1300 | 0.03 | 31 | 100 | 2.2 | 8 |
| Example Embodiment 27 | Bottom | 1300 | 0.03 | 31 | 300 | 2.2 | 8 |
| Reference Example 16 | Bottom | 800 | 0.07 | 31 | 450 | 1.3 | 45 |
| Reference Example 17 | Bottom | 1300 | 0.03 | 31 | 50 | 2.2 | 8 |
| Reference Example 18 (Only PET) | Bottom | — | — | 31 | 0 | — | — |
| Reference Example 19 (Only PP) | Bottom | — | — | 31 | 0 | — | — |

Example Embodiments (Adsorption of Insulin)

Insulin mixed inside a transport liquid container is administered to diabetics during surgery or after surgery for the purpose of ketonic acidosis or blood sugar management or blood sugar value maintenance of a living person. In this case, adsorption on the plastic of the container has been pointed out. The DLC film coated PET container of the present invention was used to solve this problem.

Namely, 300 ml of physiological saline solution was placed in each 500 ml volume plastic container, and then 2.0 ml (80 units) of an insulin source liquid was added to this and a slow stirring was carried out for 3 hours at room temperature. Then, the insulin inside the physiological saline solution was analyzed to measure the amount of remaining insulin, and the recovery percentage of insulin was calculated.

The insulin source liquid was adjusted as follows. Namely, cow insulin (25I.U./mg) manufactured by Shiguma Company was dissolved in a small amount of 0.1N hydrochloric acid solution, and distilled water was added for use as 40U/ml.

The analysis of the insulin used a radioimmunoassay method (J. Clin. Endocr., 40,400 (1974)).

The recovery percentage was calculated by Equation 2.

$$\text{Recovery Percentage (\%)} = [\text{Amount of Insulin Remaining inside Physiological Saline Solution} / \text{Added Amount of Insulin}] \times 100 \qquad \text{Equation 2}$$

In each test section, the results carried out for 5 rows formed the average of the 5 rows. The recovery percentage of insulin for the plastic containers for liquid medicine according to the present invention are shown in Table 5. In the example embodiments 22~27 of Table 5, insulin recovery percentages greater than 96% were obtained, and these results were understood to mean that the containers have low adsorptivity of effective components of medicine.

TABLE 5

| Example Embodiments | Recovery Percentage |
|---|---|
| Example Embodiment 22 | 96.8 |
| Example Embodiment 23 | 99.0 |
| Example Embodiment 24 | 96.7 |
| Example Embodiment 25 | 99.3 |
| Example Embodiment 26 | 98.4 |
| Example Embodiment 27 | 99.2 |
| Reference Example 16 | 94.5 |
| Reference Example 17 | 93.6 |
| Reference Example 18 (Only PET) | 92.2 |
| Reference Example 19 (Only PP) | 85.8 |

Example Embodiments (Adsorption of γ-Globulin)

Adjusted human globulin separated from human blood plasma components is used to treat infectious diseases and the like, but there arises a problem in the case of an injection liquid because of adsorption on the plastic container due to hydrophobic properties. The DLC film coated PET container of the present invention was used to solve this problem.

In the same manner as the example embodiments (adsorption of insulin), 300 ml of 0.01M phosphoric acid buffer solution having a pH 7.2 was placed in each 500 ml volume plastic container, and then 300 mg of γ-globulin was added and dissolved in this. A slow stirring was carried out for 3 hours at room temperature. Then, the γ-globulin inside the phosphoric acid buffer solution was analyzed to measure the amount of remaining γ-globulin, and the recovery percentage of γ-globulin was calculated. γ-globulin: a Fraction II manufactured by Seikagaku Corporation was used. The analysis of γ-globulin was based on a calorimetric method according to the Lowry method. The recovery percentage was calculated in the same manner as the example embodiments (adsorption of insulin). In each test section, the results carried out for 5 rows formed the average of the 5 rows. Measurements were carried out for DLC film coated containers manufactured under the conditions of Table 4. The recovery percentage of γ-globulin for the plastic containers for liquid medicine according to the present invention are shown in Table 6. In the example embodiments 22~27 of Table 6, γ-globulin recovery percentages greater than 97% were obtained, and these results were understood to mean that the containers have low adsorptivity of effective components of medicine.

TABLE 6

| Example Embodiments Reference Examples | Recovery Percentage |
|---|---|
| Example Embodiment 22 | 97.5 |
| Example Embodiment 23 | 98.9 |
| Example Embodiment 24 | 97.8 |
| Example Embodiment 25 | 99.2 |
| Example Embodiment 26 | 99.1 |
| Example Embodiment 27 | 99.4 |
| Reference Example 16 | 95.0 |
| Reference Example 17 | 95.3 |
| Reference Example 18 (Only PET) | 94.6 |
| Reference Example 19 (Only PP) | 90.2 |

Example Embodiments (Adsorption of Chemically Synthesized Medicine)

In the example embodiments (adsorption of insulin, adsorption of γ-globulin) there was adsorption of relatively high molecular compounds such as proteins and polysaccharides on the plastic container, and there was lowering of activity, but there also arises adsorption of low molecular chemically synthesized medicine on plastic. Tests using the containers of the present invention and PVC, PET containers were carried out for the following 4 medicines known up to now to adsorb on plastic containers.

thiopental sodium: general anesthesia medicine.
warfarin sodium: coumarin-type anticoagulant medicine.
Diazepam: minor tranquilizer, anti-anxiety medicine.
Hydrazine hydrochloride: hereditary high blood pressure disease.

A 0.9% sodium chloride solution was placed in each 500 ml volume plastic container, and then the medicines described above were added to form the concentrations shown in Table 7, whereafter such containers were left alone in a dark place at room temperature for one week. Then, the concentration of each medicine was measured, and the proportion of recovered medicine which was not adsorbed from the solution was calculated.

The measurement of the concentration of each medicine was calculated by the light absorbance due to ultraviolet absorption. The measured wavelengths are shown in Table 7. Further, at the time of measurements, the Diazepam was diluted by 0.1N sulfuric acid, and the others were diluted by water to form concentrations which were easy to measure. In each test section, the results carried out for 5 rows formed the average of the 5 rows. Measurements were carried out for DLC film coated containers manufactured under the conditions of Table 4. The recovery percentage of synthetic medicines after container storage for the plastic containers for liquid medicine according to the present invention are shown in Table 7.

Bland Space Below

TABLE 7

| | Container | Measured Wavelength (nm) | Initial Concentration (μg/ml) | Recovery Percentage (%) |
|---|---|---|---|---|
| Thiopental Sodium | Example Embodiment 22 | 289 | 10 | 98.2 |
| | Example Embodiment 23 | 289 | 10 | 99.6 |
| | Example Embodiment 24 | 289 | 10 | 98.4 |
| | Example Embodiment 25 | 289 | 10 | 99.2 |
| | Example Embodiment 26 | 289 | 10 | 99.4 |
| | Example Embodiment 27 | 289 | 10 | 99.3 |
| | Reference Example 16 | 289 | 10 | 96.7 |
| | Reference Example 17 | 289 | 10 | 91.4 |
| | Reference Example 18 (Only PET) | 289 | 10 | 85.6 |
| | Reference Example 19 (Only PP) | 289 | 10 | 64.1 |
| Warfarin Sodium | Example Embodiment 22 | 310 | 25 | 98.5 |
| | Example Embodiment 23 | 310 | 25 | 99.5 |
| | Example Embodiment 24 | 310 | 25 | 98.1 |
| | Example Embodiment 25 | 310 | 25 | 99.2 |
| | Example Embodiment 26 | 310 | 25 | 99.3 |
| | Example Embodiment 27 | 310 | 25 | 99.5 |
| | Reference Example 16 | 310 | 25 | 96.9 |
| | Reference Example 17 | 310 | 25 | 95.9 |
| | Reference Example 18 (Only PET) | 310 | 25 | 94.6 |

TABLE 7-continued

| | Container | Measured Wavelength (nm) | Initial Concentration (μg/ml) | Recovery Percentage (%) |
|---|---|---|---|---|
| | Reference Example 19 (Only PP) | 310 | 25 | 92.5 |
| Diazapam | Example Embodiment 22 | 275 | 10 | 98.1 |
| | Example Embodiment 23 | 275 | 10 | 99.2 |
| | Example Embodiment 24 | 275 | 10 | 98.7 |
| | Example Embodiment 25 | 275 | 10 | 99.4 |
| | Example Embodiment 26 | 275 | 10 | 99.3 |
| | Example Embodiment 27 | 275 | 10 | 99.4 |
| | Reference Example 16 | 275 | 10 | 96.8 |
| | Reference Example 17 | 275 | 10 | 94.2 |
| | Reference Example 18 (Only PET) | 275 | 10 | 89.8 |
| | Reference Example 19 (Only PP) | 275 | 10 | 77.8 |
| Hydrazine Hydrochloride | Example Embodiment 22 | 315 | 30 | 98.6 |
| | Example Embodiment 23 | 315 | 30 | 99.4 |
| | Example Embodiment 24 | 315 | 30 | 98.3 |
| | Example Embodiment 25 | 315 | 30 | 99.2 |
| | Example Embodiment 26 | 315 | 30 | 99.3 |
| | Example Embodiment 27 | 315 | 30 | 99.2 |
| | Reference Example 16 | 315 | 30 | 97.4 |
| | Reference Example 17 | 315 | 30 | 96.2 |
| | Reference Example 18 (Only PET) | 315 | 30 | 93.2 |
| | Reference Example 19 (Only PP) | 315 | 30 | 91.5 |

As is clear from a comparison with the reference examples, the present invention improves the recovery percentage of medicines, and this proves that the present invention is useful. In example embodiments 1~6, the recovery percentages were greater than 98%.

In the example embodiments (adsorption of insulin), the example embodiments (adsorption of γ-globulin) and the example embodiments (adsorption of chemically synthesized medicine), the three conditions of the DLC film are as follows from the viewpoint of the low adsorptivity of effective components of medicine. Namely, the composition condition is that the hydrogen atomic % is 8~35 atomic %, and preferably 8~26 atomic %. The density condition is 1.6~2.2 g/cm$^3$, and preferably 1.8~2.2 g/cm$^3$. The film thickness condition is 100~450 Å, and preferably 100~400 Å.

Accordingly, from the viewpoint of satisfying all the oxygen barrier properties, the water vapor barrier properties and the low adsorptivity of effective components of medicine, the three conditions of the DLC film are as follows. Namely, the composition condition is that the hydrogen atomic % is 10~35 atomic %, and preferably 15~26 atomic %. The density condition is 1.6~2.1 g/cm$^3$, and preferably 1.8~2.0 g/cm$^3$. The film thickness condition is 180~350 Å, and preferably 200~320 Å.

Example Embodiments (Lowering of Activity of Heparin)

Syringes (containers) capable of holding 50 ml of solution were made from each plastic, and inside these a heparin source liquid was added to 50 ml of a 0.9% sodium chloride solution to form a solution having 500 units/ml, and then the syringes were plugged and left alone at room temperature for two weeks. After two weeks, the heparin activity inside the solution was measured, and the effect on heparin activity of each container was examined.

The container formed with a DLC film under the same conditions as the conditions of Example Embodiment 22 of Table 4 formed Example Embodiment 28 of Table 8, and in the same manner the containers formed with a DLC film under the same conditions as the conditions of example embodiments 23~27 of Table 4 formed example embodiments 29~33 of Table 8. Further, also for the reference examples, the containers formed with a DLC film under the same conditions as the conditions of reference examples 16~19 of Table 4 formed reference examples 20~23 of Table 8.

As for the heparin source liquid, the heparin (sodium salt) used material derived from pig intestine mucus, in which there was 26000 units/ml and the molecular weight was 11000~14000. The measurement of heparin activity was carried out by the method of Babson et al. (Am. J Clin Pathol. 62, 856(1974)). In each test section, the results carried out for 5 rows formed the average of the 5 rows. The active components maintenance percentages (amount of active components (after lowering)/amount of active components (initial value=500)) of heparin are shown in Table 8.

From the results of example embodiments 28~33, compared with the reference examples, it is clear that the present invention preserves the maintenance of the activity of the heparin solution. In example embodiments 28~33, the activity maintenance percentage was greater than 94%. Accordingly, in the example embodiments there was considered to be almost no (1) adsorption onto the container inner wall surfaces and no (2) bonding with eluted material from inside the resin which lower the activity of heparin.

TABLE 8

| Example Embodiments | Active Components Maintenance Percentage (%) |
|---|---|
| Example Embodiment 28 | 96.2 |
| Example Embodiment 29 | 95.9 |
| Example Embodiment 30 | 96.3 |
| Example Embodiment 31 | 94.8 |
| Example Embodiment 32 | 96.2 |
| Example Embodiment 33 | 94.1 |
| Reference Example 20 | 91.6 |
| Reference Example 21 | 90.4 |
| Reference Example 22 (Only PET) | 88.0 |
| Reference Example 23 (Only PP) | 86.0 |

The invention claimed is:

1. A plastic container for liquid medicine having a DLC (Diamond Like Carbon) film formed on the inner surfaces thereof, wherein the water vapor permeability is 0~0.006 g/container/day, and the oxygen permeability is 0~0.01 ml/container/day when liquid medicine is sealed in said plastic container by appropriately changing the three conditions of composition, density and film thickness of said DLC film so that the hydrogen atomic % of said DLC film is greater than or equal to 10 atomic % and less than 50 atomic %, the density of said DLC film is greater than 1.3 g/cm$^3$ and less than or equal to 1.6 g/cm$^3$, and the film thickness of said DLC film lies within the range of 180~350Å.

2. The plastic container for liquid medicine having a DLC film formed on the inner surfaces thereof described in claim 1, wherein the inner wall surfaces of the plastic container are formed to have low adsorptivity for effective components of the medicine by appropriately changing the three conditions of composition, density and film thickness of said DLC film.

3. The plastic container for liquid medicine having a DLC film formed on the inner surfaces thereof described in claim 1 wherein the inner wall surfaces of the plastic container are formed to have a high maintenance percentage for the activity of effective components of the medicine by appropriately changing the three conditions of composition, density and film thickness of said DLC film.

4. A method of storing and recovering liquid medicine, wherein the plastic container of claim 1 having a DLC film of a density greater than 1.3 g/cm$^3$ and less than or equal to 1.6 g/cm$^3$ which has undergone appropriate changes of the three conditions of composition, density and film thickness formed on the inside surfaces thereof is directly filled with the liquid medicine, storage is carried out in a state where the activity of effective components of the medicine is maintained and the liquid medicine is recovered while suppressing the adsorption of the effective components of said liquid medicine to the inner wall surfaces of said plastic container when said liquid medicine is used by breaking the seal of said plastic container or drawing out liquid medicine.

5. The plastic container for liquid medicine described in claim 1, wherein the medicine is a protein, a peptide or a glycoprotein.

6. The plastic container for liquid medicine described in claim 1 wherein the container is formed of polyethylene terephthalate resin.

* * * * *